United States Patent [19]

Azad

[11] Patent Number: 5,394,830
[45] Date of Patent: Mar. 7, 1995

[54] APPARATUS AND METHOD FOR GROWING LONG SINGLE CRYSTALS IN A LIQUID ENCAPSULATED CZOCHRALSKI PROCESS

[75] Inventor: Farzin H. Azad, Clifton Park, N.Y.

[73] Assignee: General Electric Company, Schenectady, N.Y.

[21] Appl. No.: 112,275

[22] Filed: Aug. 27, 1993

[51] Int. Cl.⁶ ............................................. C30B 35/00
[52] U.S. Cl. ..................................... 117/222; 117/17; 117/208
[58] Field of Search ................. 156/601, 617.1, 618.1, 156/DIG. 70, 619.1; 422/246, 249

[56] References Cited

U.S. PATENT DOCUMENTS

| | | | |
|---|---|---|---|
| 3,798,007 | 3/1974 | Bochman et al. | 23/301 |
| 3,833,342 | 9/1974 | Holliday et al. | 23/273 |
| 4,233,270 | 11/1980 | Schmidt | 422/249 |
| 4,239,583 | 12/1980 | Hatch et al. | 156/601 |
| 4,478,676 | 10/1984 | Belt et al. | 156/616.1 |
| 4,586,979 | 5/1986 | Katsumata et al. | 156/601 |
| 4,591,994 | 5/1986 | Washizuka et al. | 364/500 |
| 4,604,262 | 8/1986 | Nishizawa | 422/310 |
| 4,613,486 | 9/1986 | Tatsumi et al. | 422/249 |
| 4,622,211 | 11/1986 | Suzuki et al. | 422/248 |
| 4,659,421 | 4/1987 | Jewett | 156/617.1 |
| 4,687,646 | 8/1987 | Mateika et al. | 422/249 |
| 4,752,451 | 6/1988 | Aubert et al. | 422/249 |
| 4,797,174 | 1/1989 | Comera et al. | 156/616.1 |
| 4,830,703 | 5/1989 | Matsutani | 156/617.1 |
| 4,857,278 | 8/1989 | Gevelber et al. | 422/249 |
| 4,863,553 | 9/1989 | Lehoczky et al. | 422/249 |
| 4,957,713 | 9/1990 | Kravetsky et al. | 156/617.1 |
| 5,132,091 | 7/1992 | Azad | 422/249 |
| 5,137,699 | 8/1992 | Azad | 422/248 |

*Primary Examiner*—R. Bruce Breneman
*Assistant Examiner*—Felisa Garrett
*Attorney, Agent, or Firm*—Paul R. Webb, II

[57] ABSTRACT

Apparatus and method are provided for growing improved quality long and large single crystals in a liquid encapsulated Czochralski (LEC) process, in which a separate cooling circuit is provided for the upper portion of a vessel which cools that portion independently of any cooling means for the lower portion of the vessel, and in which the gas flow pattern can desirably be controlled such that the gas flow is predominantly downward adjacent the vessel wall, and predominantly upward near the center of the vessel, where the crystal is being pulled from the melt. The apparatus is also provided with a thermal shielding device having an inner and an outer shield tube, connected in fixed positions to a flange member which extends radially from the inner shield tube to a point immediately adjacent the vessel side wall, with the inner shield being disposed to prevent direct radiative heat transfer from the wall of a crucible holding a melt of the material to be pulled into the crystal, to the crystal being pulled from the melt in the crucible. The outer shield tube, the flange member, a lower barrier, and the vessel wall define the boundaries of a convective cell which desirably regulates, to make uniform, the thermal environment to which the crucible is exposed when raised from the region in which it is surrounded by a heater.

26 Claims, 2 Drawing Sheets

APPARATUS AND METHOD FOR GROWING LONG SINGLE CRYSTALS IN A LIQUID ENCAPSULATED CZOCHRALSKI PROCESS

The following invention was made with government support via contract number DAAL03-91-C-0009. The government has certain rights in this invention.

BACKGROUND OF THE INVENTION

1. Field of the Invention

The present invention relates to an apparatus and method for growing large, long, high-quality single crystals, and more specifically to an apparatus and method for maintaining a favorable thermal environment for the growth of longer single crystals in a liquid-encapsulated Czochralski (LEC) method.

2. Description of the Related Art

The well-known Czochralski or LEC method of growing single crystals involves contacting a seed crystal with a melt of the material to be drawn into a crystal, the melt being contained in a heated crucible. The growth of longer and larger diameter substantially defect-free crystals continues to be a goal pursued by those working in this field. Many difficulties and complications are encountered in attempts to improve upon the basic LEC process in order to grow the longer and larger diameter crystals, largely attributable to the melt thermal conditions, the thermal conditions in the crystal solidification zone, and the thermal environment in the upper portion of the vessel.

Various methods for controlling the axial thermal gradient in the crystal being grown have been reported in the art, and those methods generally involve the use of active or passive heat shields. Control of the axial thermal gradient through the use of heat shields is proposed to minimize stress and reduce dislocation density in the crystal being pulled. The use of such heat shields, however, has met with only limited success in practice, and the goal of achieving longer and larger defect-free crystals in a production setting has remained elusive.

It is therefore a principal object of the present invention to provide an apparatus and method which achieve the above-stated, and heretofore elusive, goal of being able to grow larger, longer, substantially defect-free single crystals.

It is another principal object of the present invention to provide an apparatus which broadens the process window for the growth of high quality, long single crystals by improving the control over the thermal environment in an LEC crystal puller.

It is a further principal object of the present invention to provide a method for controlling the thermal environment in an LEC crystal puller, which method has the effect of broadening the process window for the growth of high quality long single crystals.

It is an additional object of the present invention to provide an apparatus in which the cooling of an outer vessel is achieved by using two separate cooling circuits or fluid paths, a first of which cools the lower portion of the vessel where the crucible and heater are disposed, and a second of which cools the upper portion of the vessel to which the pulled crystal is exposed, and in which the cooling circuits can be used to control the direction of gas flow within the vessel.

It is an additional object of the present invention to provide an apparatus in which a stationary shield means is provided to surround the crucible or susceptor wall, above and at an inner and outer periphery thereof, which provides a more uniform thermal environment for the emerging crystal.

It is yet an additional object of the present invention to provide a method for controlling the direction of gas flow within the vessel and for controlling the thermal environment at the region of the emerging crystal, in order to provide overall favorable thermal conditions enabling the growth of larger and longer high quality, substantially defect-free single crystals.

SUMMARY OF THE INVENTION

The above and other objects of the present invention are accomplished by providing, in an otherwise essentially standard LEC crystal pulling apparatus, two separate cooling circuits or cooling fluid flow paths, and by providing a shield means to control the thermal environment in and around the exposed portion of the crucible extending above the heater, which in turn regulates the thermal environment at the liquid-solid interface where the crystal emerges from the melt. The discussion herein will concentrate on the growth of GaAs single crystals, however, it is to be recognized that the apparatus and method will have other applications, such as in growing advanced metallic and superalloy single crystals.

Reference will be made initially to FIG. 1, which illustrates, in substantially schematic form, the major components of known CI 358 crystal puller, available in the market from Cambridge Instruments. The ensuing discussion of this figure will aid in pointing out several problem areas in thermal environment control discovered by the inventor herein.

The apparatus 10 comprises an outer containment vessel 12 having a top plate 14, a base plate 16, and vessel side wall 18, defining a substantially cylindrical volume in the vessel interior. Extending downwardly from the top 14 of the vessel is a puller rod 20, with a chuck 22 attached at a lower end thereof. The chuck 22 is configured to have a crystal seed 24 mounted thereon, in a manner well known in the art. The puller rod 20 has means (not shown) for raising the chuck 22 and crystal seed 24 toward the top of the vessel.

In the lower section 26 of the vessel, a susceptor 28, preferably made of graphite, has a crucible 30 therein, which is preferably made of boron nitride. The susceptor/crucible subassembly is provided to contain a melt 32 of the material to be pulled into crystal 34. The melt is covered by a suitable encapsulant 36, also well known in the art. The susceptor/crucible preferably defines a substantially cylindrical side wall and is surrounded by a heater 38 which is positioned immediately adjacent the outer wall surface of the susceptor 28 when the susceptor is in its lowermost position. The heater 38 is in turn surrounded by insulation layer 40.

In this apparatus, the heater 38 remains in a fixed position, while the susceptor is provided with raising and rotating means 42, well known in the art, which is controlled to raise and rotate the susceptor/crucible as the crystal 34 is pulled. The susceptor/crucible is raised in order to maintain the melt surface at a constant height, as the amount of melt decreases as it is pulled into the crystal. This is a known processing technique which is employed to improve the quality of (i.e., reduce the amount of defects in) the pulled crystal. It will be recognized by those skilled in the art that FIG. 1 depicts the apparatus in a typical "mid-process" configuration, in which the crystal 34 has reached an appreciable length, and in which the susceptor/crucible has been elevated accordingly.

A further illustrated feature is the provision of, at the interior of the vessel side wall 18, a cooling water sleeve 44, containing helical passages 46, 48. The FIG. 1 embodiment, the cooling water inlet 50 is disposed at the lower extent of the vessel, and the cooling water outlet 52 is disposed at the upper end of the vessel. A transfer coupling 54 is provided at a point along the height of the vessel wall, to transfer the cooling water exiting the lower helical passage 48 into the upper helical passage 46. The flow directions of the cooling water are indicated by arrows F, for simplicity, and the actual fluid tubes or hoses are thus not depicted.

In the course of developing the invention disclosed herein, the inventor determined that several design features of the FIG. 1 apparatus give rise to time-varying thermal disturbances during the operation of the apparatus in pulling crystals, which disturbances contribute to an undesirable thermal environment. Again with reference to FIG. 1, the following factors have been identified as contributing to undesirable thermal conditions.

Lifting or raising the susceptor/crucible, to keep the melt surface at the same location with respect to the heater, creates a time-varying exposure of the top of the susceptor/crucible to the cooled vessel wall 18. This creates a thermal disturbance in the melt contained in the crucible and also affects the radiative heat transfer between the emerging crystal 34 and the inner wall of the crucible 30.

With the surface of the emerging crystal exposed to the inner wall of the crucible 30, any change to the heater temperature affects not only the temperature of the melt 32, which is the desired result, but the change also affects the thermal gradient in the crystal being grown.

The cooling water flow configuration is such that the temperature of the vessel wall 18 increases axially in a direction toward the top of the vessel. The top plate 14 is cooled independently, as schematically illustrated by tube ends 15. Cooling water is passed through these tubes or other fluid conduits to cool the top plate. Thus the top plate will be relatively cool compared to the upper portion of the vessel wall 18. The resulting gas flow pattern is one which moves the gas predominantly downwardly at the center of the vessel onto the upper surface of the pulled crystal, and predominantly upwardly in the region adjacent the side wall of the vessel. This flow pattern results in the convective heat transfer from the crystal and the exposed portion of the susceptor/crucible being somewhat random and unpredictable.

Each of the above factors detracts from establishing a more highly uniform and desirable thermal environment which is conducive to growing substantially defect-free crystals. Problems with undesirable thermal conditions are magnified when attempts are made to increase the length and/or the diameter of the crystal being grown, thus making it increasingly more difficult to obtain high quality crystals.

The present invention provides an apparatus and method which overcome the problems associated with the above-noted factors, thus providing an improved ability to produce longer and larger high quality single crystals. The apparatus of the present invention provides improved control over the gas flow pattern, and particularly the direction thereof, by providing independent vessel wall cooling means for the upper crystal solidification portion of the vessel and for the lower, crucible containing, portion of the vessel.

In addition, the apparatus provides a radiative shield means which is configured and positioned to receive the upper portion of the susceptor/crucible therein when the susceptor/crucible is raised during operation of the apparatus. The shield means is also configured and positioned in the vessel to create a self-contained free convection cell at the level of the shield above the heater and insulation, which helps to uniformly transfer heat from the shield means to the vessel wall, resulting in a more predictable and uniform thermal condition at the level of the crucible.

BRIEF DESCRIPTION OF THE DRAWINGS

These and other features of the present invention and the attendant advantages will be readily apparent to those having ordinary skill in the art, and the invention will be more easily understood from the following detailed description of the preferred embodiment of the present invention, taken in conjunction with the accompanying drawings, wherein like reference characters represent like parts throughout the several views, and wherein.

DETAILED DESCRIPTION OF THE PREFERRED EMBODIMENT

Figure 1:
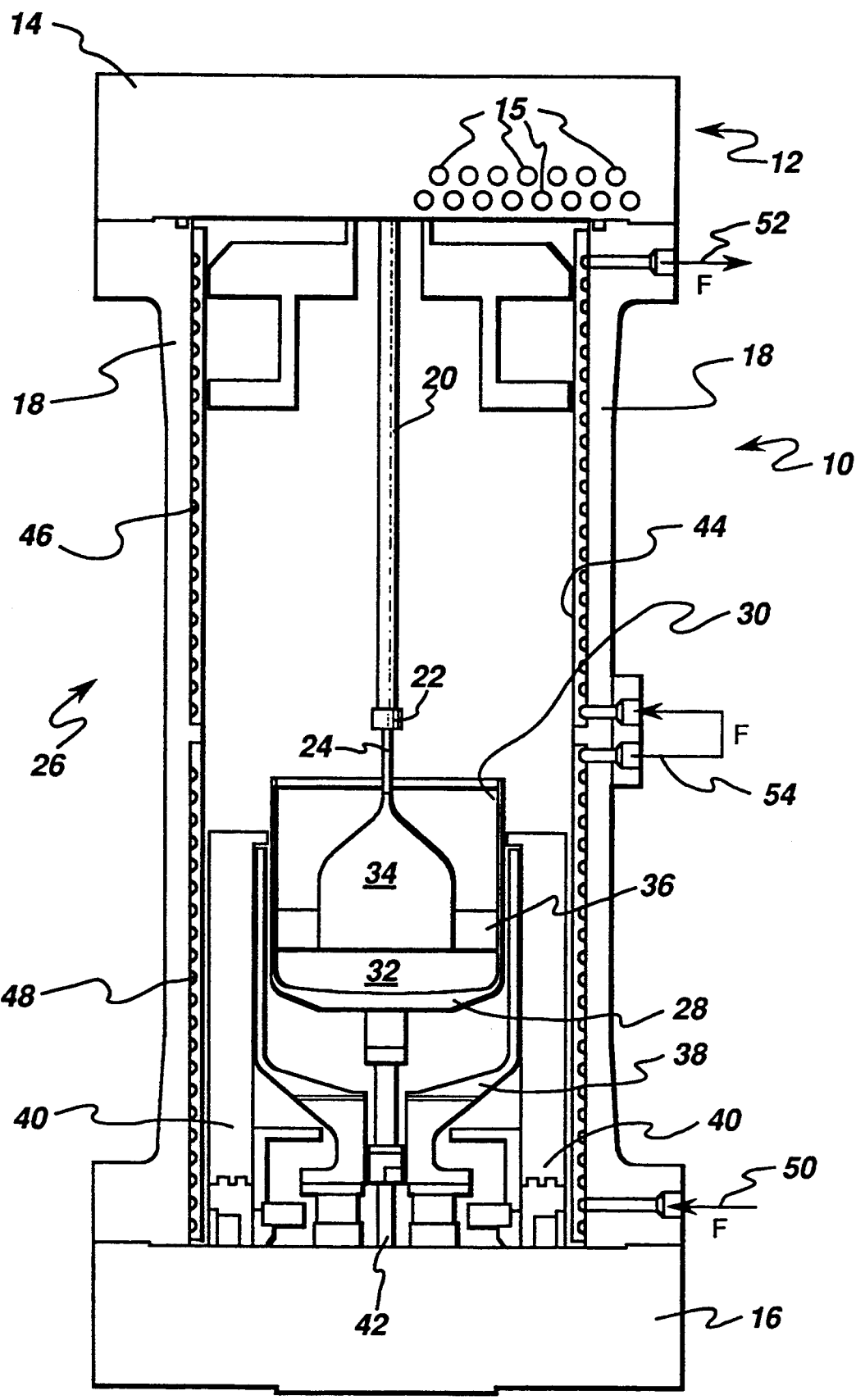
FIG. 1 is a substantially schematic cross-section view of an apparatus known in the art for pulling a single crystal from a melt.
Figure 2:
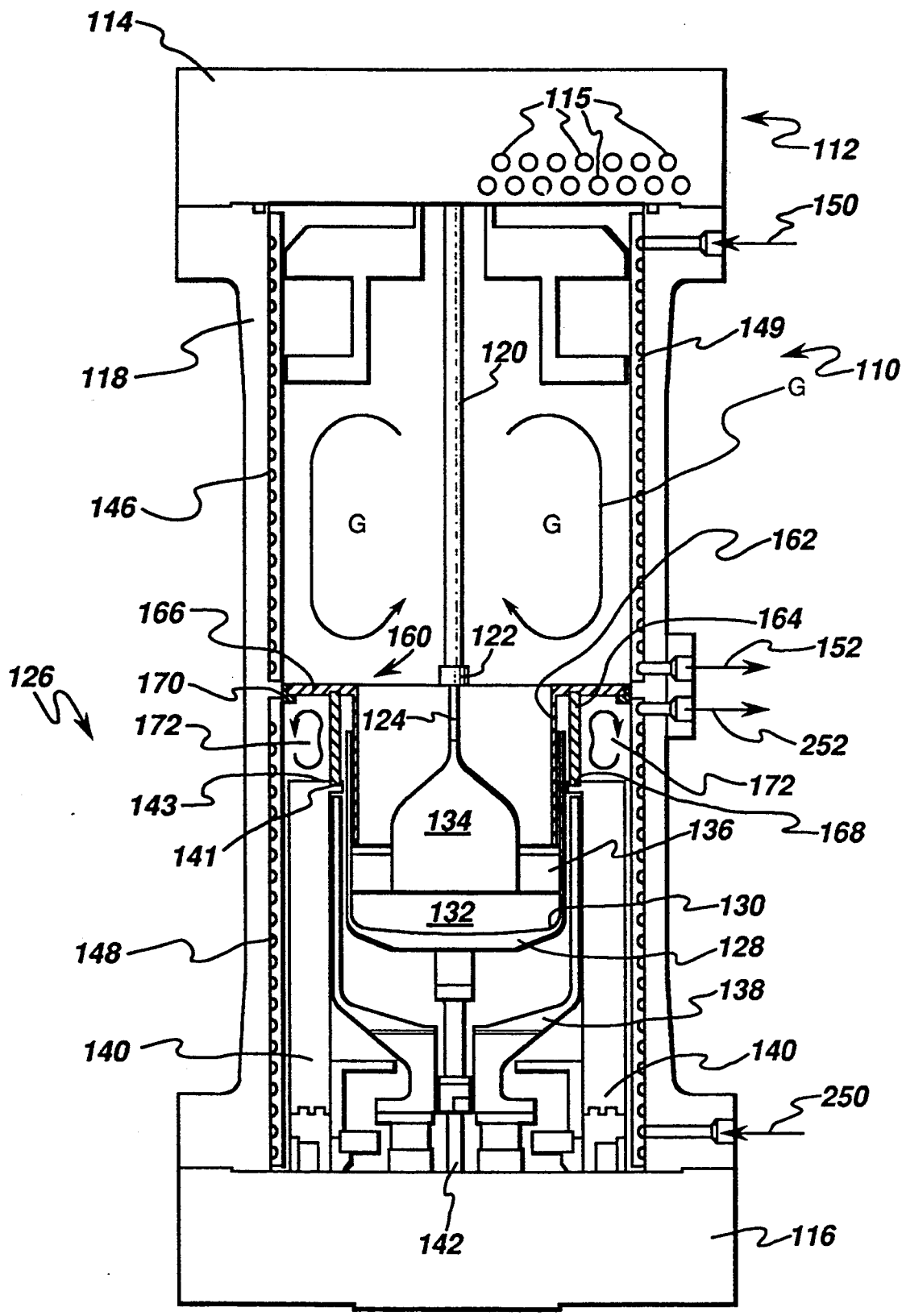
FIG. 2 is a substantially schematic cross-section view of an apparatus for pulling a single crystal from a melt in accordance with a preferred embodiment of the present invention.

The apparatus according to a preferred embodiment of the present invention is depicted in FIG. 2. The apparatus preferably contains many of the same components as the apparatus shown in FIG. 1, and it may, in fact, prove to be most advantageous to start with the design of the FIG. 1 apparatus, and to incorporate the inventive features disclosed herein, to produce an apparatus according to the present invention.

The FIG. 2 apparatus 110 comprises an outer containment vessel 112, having a top plate 114, a base plate 116, and vessel side wall 118, defining a substantially cylindrical volume in the vessel interior. Extending downwardly from the top plate 114 of the vessel is a puller rod 120, with a chuck 122 attached at a lower end thereof. The chuck 122 is configured to have a crystal seed 124 mounted thereon, in a manner well known in the art. As is also well known in the art, the puller rod 120 has means (not shown) for raising the chuck 122 and crystal seed 124 toward the top of the vessel.

In the lower section 126 of the vessel, a susceptor 128, preferably made of graphite, has a crucible 130 disposed therein, which is preferably made of boron nitride. The susceptor/crucible subassembly is provided to contain a melt 132 of the material to be pulled into crystal 134. The melt is covered by a suitable encapsulant 136, also well known in the art. The susceptor/crucible preferably defines a substantially cylindrical side wall and is surrounded by a heater 138, which is positioned immediately adjacent the outer wall surface of the susceptor 128, when the susceptor is in its lowermost position. The heater 138 is in turn surrounded by insulation layer 140.

The heater 138 preferably remains in a fixed position in this apparatus, while the susceptor 128 is provided with raising and rotating means 142, well known in the art, which is controlled to raise and rotate the susceptor/crucible as the crystal 134 is pulled.

In this preferred embodiment, upper and lower cooling water sleeves 146, 148 are provide, each of which may preferably comprise a helical passage within a liner 149 at the interior of vessel side wall 118. In contrast to the FIG. 1 apparatus, two separate cooling circuits are provided, which allows independent control of the thermal conditions in the upper and lower portions of the vessel. Each of the upper and lower sleeves 146, 148 has in inlet 150, 250 which receives fresh cooling water, and an outlet 152, 252, for discharging the cooling water. The cooling water is not passed from the lower sleeve to the upper sleeve, as it is in the FIG. 1 apparatus.

The cooling water inlet 250 for the lower sleeve 148 is disposed at a lower end of the vessel, with the outlet 252 disposed at a point along the axial extent of the vessel side wall 118 approximately just below a height at which a flange member 166 is disposed. The flange member 166 will be discussed in further detail later in this specification. The inlet 150 for upper sleeve is at an upper extent of the vessel side wall 118, adjacent top plate 114, which, like its counterpart in FIG. 1, is also preferably independently cooled by running cooling water through a plurality of tubes 115. The cooling water outlet 152 for upper sleeve is preferably disposed just above the point along the axial extent of the vessel side wall 118 at which flange member 166 is located.

By configuring the vessel such that the cooling water in the upper sleeve 156 enters at the top of the vessel side wall 118, the outer peripheral regions at the top of the vessel will be cooler than the central region at the top of the vessel, and the gas, generally argon, in the vessel will establish a pattern in which a predominantly upward flow at the central region of the vessel occurs, with a corresponding predominantly downward flow adjacent the vessel side walls, as depicted with arrows G in FIG. 2. This direction for the gas flow contributes to providing a more uniform thermal environment for the emerging crystal.

Another feature of the apparatus of the present invention which aids in creating improved thermal conditions within the vessel is the provision of a shield means 160 disposed at an axial position within the vessel 110 where the pulled crystal 134 emerges from the melt and undergoes cooling. Shield means 160 preferably is made up of substantially concentric inner and outer cylindrical tubes 162, 164, with a horizontally disposed flange member 166, which preferably extends radially outwardly from inner tube 162 to substantially the inner surface of vessel side wall 118.

The shield means may preferably be mounted in position by providing an annular groove 141 on the inwardly extending lip 143 of insulation layer 140, wherein the groove 141 is adapted to receive and support thereon the lower edge 168 of outer shield tube 164. Alternatively, or in addition to supporting the shield means 160 with insulator layer 140, a plurality of brackets 170 could be provided on the inner side wall 118 of the vessel to receive and support thereon the radial outer portion of flange member 166. Numerous other support and/or attachment means will be readily apparent to those having ordinary skill in the art after reading this disclosure.

The position of the shield means 160 relative to the position and range of travel of the susceptor/crucible is important in providing the desired improved thermal environment. The spacing provided between inner and outer shield tubes 162, 164 is to be nominally greater than the wall thickness of the susceptor/crucible subassembly, so that the upper wall portion of the susceptor/crucible may be raised into that space. Inner shield tube 162 is thus to have an outer diameter slightly less than the inner diameter of the susceptor/crucible. Outer shield tube 164 will have an inner diameter slightly greater than an outer diameter of the susceptor 128. The spacing between the shield tubes 162, 164 is maintained by their affixation to flange member 166. Either one or both of the shield tubes 162, 164 may be formed integrally with flange member 166, or may be secured thereto by a bonding process.

Shield means 160 is also to be positioned such that the lower surface of the horizontally extending flange member 166 is at a height sufficient to permit the susceptor/crucible to be raised and lowered through its full range of motion, as the shield means 160 will preferably constitute a stationary component in the vessel. The axial extent of inner shield tube 162 is preferably such that it will extend downwardly as far as possible without contacting the encapsulant material 136 disposed within the crucible 130. It is again to be noted that this apparatus is designed to raise the crucible during crystal pulling, but only to maintain the upper surface of the melt at a constant height. As such, the upper surface of the encapsulant material 136 will also remain at a substantially constant height, and the preferred length of inner shield tube 162 can be determined accordingly.

In this preferred embodiment of shield means 160, the outer shield tube 164 extends along substantially the entire axial distance between the upper lip 143 of insulator layer 140 and flange member 166. Flange member 166 extends radially outwardly from outer shield tube 164 to a position immediately adjacent vessel side wall 118, or possibly in contact with the side wall. Further, it is desired that insulator layer 140 be sized such that the exterior surface thereof is also immediately adjacent the vessel side wall 118. With such a configuration, as can be seen in FIG. 2, a substantially isolated, independent convective cell 172 is formed.

The several advantages provided by the shield means 160, both alone and in conjunction with the provision of separate upper and lower vessel side wall cooling circuits, will now be discussed in further detail. A first advantage resulting from providing shield means 160 is that the problems caused by the time-varying exposure of the susceptor 128 to the cold vessel wall 118 as the susceptor is raised in conducting the pulling process are effectively eliminated. The self-contained free convection cell 172, bounded by the shield means 160, insulator layer 140 and vessel wall 118, is used to transfer heat from the outer shield tube 164, which tube will now be adjacent the wall of the raised susceptor. This keeps the outer shield tube 164 at a more uniform temperature than the temperature pattern to which the susceptor is exposed in the FIG. 1 apparatus as the susceptor is raised.

The inner shield tube 162 provides the advantage that direct radiative exchange between the emerging crystal 134 and the inner wall of crucible 130 is prevented. As noted previously, one of the problems with the FIG. 1 apparatus, in which the surface of the emerging crystal is directly exposed to the crucible, is that when the heater temperature is changed to maintain the constant melt temperature, the heater temperature change can cause an appreciable temperature change at the crucible wall above the melt, which in turn affects the thermal environment to which the emerging crystal is exposed, thereby also affecting the thermal gradient in the crystal. The inner shield tube minimizes this adverse effect by eliminating the direct radiative exchange between the crystal and the crucible wall.

Further, because the shield means 160, and in particular the inner shield tube 162 is a stationary component, unlike the crucible 130 and susceptor, which are lifted during the crystal pulling process, the inner shield tube 162 provides a more constant radiative boundary condition for the growing crystal.

The shield means 160 is preferably constructed of a material having a high thermal conductivity. An especially preferred material for this component is a grade ATJ graphite.

As discussed previously, the provision of separate upper and lower vessel side wall cooling circuits, and particularly an upper circuit which introduces the cooling water at the upper extent of the vessel side wall, results in having a more desirable gas flow pattern which is predominantly downward near the vessel wall. This gas flow pattern, in combination with the high conductivity of the inner shield tube 162 creates a more uniform thermal environment for the emerging crystal 134. The thermal environment surrounding the crystal is, in the apparatus of the present invention, more dominated by the gas flow in the upper portion of the vessel, and is thus less susceptible to changes in heater temperature, which changes heretofore were found to have a significant and generally adverse effect on the quality of the grown crystal. The present apparatus thus brings about the virtual elimination of defects in the grown crystal, and facilitates the growing of substantially defect-free longer and larger diameter crystals.

The method of the present invention for growing substantially defect-free single crystals entails pulling a solid crystal 134 from a melt 132 of material disposed in a melt-containing crucible 130, which in turn is disposed within a vessel 110, and controlling a gas flow pattern G in a portion of the vessel above the crucible such that the gas flow is predominantly downward adjacent the vessel side wall 118.

Another method for growing substantially defect-free single crystals in accordance with the present invention entails pulling a solid crystal 134 from a melt 132 of material disposed in a melt-containing crucible 130 and susceptor 128 subassembly, which is in turn located within a vessel 110, raising the crucible/susceptor as the crystal is pulled to maintain an upper surface of the melt at a constant height, and providing a convection cell 172 in the region of the vessel 110 into which the upper portion of the crucible/susceptor is moved when raised, to shield the susceptor from the vessel wall.

Alternatively, the method of the present invention may entail combining the steps set forth in the two variations of the method set forth above. The method may thus involve pulling the solid crystal 134, controlling the gas flow pattern G in the upper portion of the vessel, and further providing the convention cell 172 as discussed in more detail above.

It is to be recognized that the foregoing detailed description of the preferred embodiment of the invention is given merely by way of illustration, and that numerous modifications and variations may become apparent to those skilled in the art without departing from the spirit and scope of the invention. Therefore, the scope of the present invention is to be determined by reference to the appended claims.

What is claimed is:

1. An apparatus for growing long single crystals in a liquid encapsulated Czochralski process, comprising:
    vessel means defining a generally enclosed axially extending volume;
    means for containing a melt of material to be grown into a crystal, said melt containing means being disposed in a lower portion of said enclosed volume of said vessel means;
    heater means for maintaining said melt of material in said melt-containing means in a desired bulk thermal condition, said heater means also being disposed in a lower portion of said enclosed volume of said vessel means; and
    first means for cooling an upper portion of a side wall of said vessel means independently of a lower portion of said side wall of said vessel means, said first cooling means further having means for maintaining an axial temperature gradient in said upper portion of said side wall in which an uppermost extent of said upper portion is maintained at a lower temperature than a lowermost extend of said upper portion.

2. Apparatus as recited in claim 1 further comprising second means for cooling lower portion of said side wall of said vessel means independently of said first cooling means.

3. Apparatus as recited in claim 2 wherein said first cooling means comprises cooling water passage means disposed under an inner surface of said vessel side wall, said passage means having a cooling water inlet disposed adjacent said uppermost extent of said upper portion of said vessel wall, and having a cooling water outlet disposed at an axial position lower than said cooling water inlet.

4. Apparatus as recited in claim 3, wherein said cooling water passage means of said first cooling means extends in a helical path along the circumference of said vessel side wall.

5. An apparatus for growing long single crystals in a liquid encapsulated Czochralski process, comprising:
    vessel means defining a generally enclosed axially extending volume, said enclosed volume being bounded on its sides by a vessel side wall;
    means for containing a melt of material to be grown into a crystal, said melt containing means being disposed in a lower portion of said enclosed volume of said vessel means;
    means for pulling a crystal from said melt of material at an approximately central region of said melt containing means; and
    shielding means comprising a first shield tube for thermally shielding said crystal being pulled from an inner surface of an upwardly extending side wall of said melt containing means, to substantially prevent direct radiative exchange between said crystal being pulled and said upwardly extending sidewall, said shielding means extending downwardly into said melt containing means to a height at which said crystal being pulled emerges from a melt encapsulant covering said melt.

6. Apparatus as recited in claim 5, wherein said shielding means further comprises a horizontally oriented flange member extending outwardly from an upper end of said first shield tube and terminating immediately adjacent to said vessel side wall, said flange member defining an upper portion of said vessel above said flange member and a lower portion of said vessel below said flange member.

7. Apparatus as recited in claim 6, wherein said shielding means further comprises a second, outer shield tube extending downwardly from said flange member, said second outer shield tube having a diameter large enough to surround an outer surface of said upwardly extending side wall of said melt containing means, said second outer shield tube being adapted to thermally shield said outer surface of said upwardly extending side wall of said melt containing means from said vessel side wall then said melt containing means is in a position whereby said second outer shield surrounds said outer surface of said upwardly extending side wall.

8. Apparatus as recited in claim 7 further comprising first means for cooling an upper portion of said vessel side wall independently of a lower portion of said vessel side wall, said first cooling means further having means for maintaining an axial temperature gradient in said upper portion of said vessel side wall in which an uppermost extent of said upper portion is maintained at a lower temperature than a lowermost extent of said upper portion.

9. Apparatus as recited in claim 7 wherein said shielding means is made of a material having a high thermal conductivity.

10. Apparatus as recited in claim 9 wherein said shielding means material is a high thermal conductivity graphite.

11. Apparatus as recited in claim 7 wherein said melt containing means is surrounded at least on its sides by a stationary heater means which substantially conforms in shape to an outer surface of said melt containing means, and wherein said apparatus further comprises means for raising said melt containing means within the vessel means to maintain an upper surface of said melt at a constant height.

12. Apparatus as recited in claim 11, wherein said shielding means is mounted to remain substantially stationary within said vessel means, and wherein said shielding means is positioned such that said side wall of said melt containing means is received into a space between said first shield tube and said second outer shield tube when said melt containing means is raised by said raising means.

13. Apparatus as recited in claim 12, wherein said second outer shield tube has means disposed at a lower end thereof fro creating a lower barrier surface extending radially across a spacing between said vessel side wall, and said heater and melt containing means, and wherein said barrier surface means, said second outer shield tube, said flange member, and an inner surface of said vessel side wall define a convective cell extending along the periphery of the vessel means which provides a uniform thermal environment for the outer surface of the side wall of the melt containing means as the side wall is raised to a level higher than the heater means.

14. Apparatus as recited in claim 13, wherein said barrier surface means comprises an upper surface of an insulator panel means disposed between an outer surface of said heater means and an inner surface of said vessel side wall.

15. Apparatus as recited in claim 14, wherein said shielding means is mounted in place by an abutment of a lower surface of said outer shield tube against an upper surface of said insulator panel means.

16. Apparatus as recited in claim 5 further comprising first means for cooling an upper portion of said vessel side wall independently of a lower portion of said vessel side wall, said first cooling means further having means for maintaining an axial temperature gradient in said upper portion of said vessel side wall in which an uppermost extent of said upper portion is maintained at a lower temperature than a lowermost extent of said upper portion.

17. Apparatus as recited in claim 5 wherein said shielding means is made of a material having a high thermal conductivity.

18. Apparatus as recited in claim 5 wherein said shielding means material is a high thermal conductivity graphite.

19. An apparatus for growing long single crystals in a liquid encapsulated Czochralski process, comprising:
  vessel means defining a generally enclosed axially extending volume, said enclosed volume being bounded on its sides by a vessel side wall;
  means for containing a melt of material to be grown into a crystal, said melt containing means being disposed in a lower portion of said enclosed volume of said vessel means;
  means for pulling a crystal from said melt of material at an approximately central region of said melt containing means; and
  a convective cell disposed radially outwardly and axially immediately above an initial height of said melt containing means, a radial inner boundary of said convective cell comprising an outer shield tube having a diameter large enough to surround an outer surface of said melt containing means without making contact therewith, a radial outer boundary of said convective cell comprising said vessel side wall, said convective cell further having upper and lower barrier means spanning nearly an entire distance between said inner and outer boundaries of said convective cell.

20. Apparatus as recited in claim 19, wherein said upper barrier means of said convective cell comprises a horizontally oriented flange member extending outwardly from an upper end of said outer shield tube and terminating immediately adjacent to said vessel side wall, and wherein said flange member delineates an upper portion of said vessel means axially above said flange member and a lower portion of said vessel means axially below said flange member.

21. Apparatus as recited in claim 20, further comprising an inner shield tub for thermally shielding said crystal being pulled from an inner surface of an upwardly extending side wall of said melt containing means, to substantially prevent direct radiative exchange between said crystal being pulled and said upwardly extending sidewall, said shielding means extending downwardly from an inner radial extent of said flange member into said melt containing means to a height at which said crystal being pulled emerges from a melt encapsulant covering said melt.

22. Apparatus as recited in claim 21 wherein said melt containing means is surrounded at least on its sides by a stationary heater means which substantially conforms in shape to an outer surface of said melt containing means, and wherein said apparatus further comprises means for raising said melt containing means within the vessel means to maintain an upper surface of said melt at a constant height.

23. Apparatus as recited in claim 22 further comprising first means for cooling an upper portion of said vessel side wall independently of a lower portion of said vessel side wall, said first cooling means further having means for maintaining an axial temperature gradient in said upper portion of said vessel side wall in which an uppermost extent of said upper portion is maintained at a lower temperature than a lowermost extent of said upper portion.

24. Apparatus as recited in claim 22, wherein said shielding means is mounted to remain substantially stationary within said vessel means, and wherein said shielding means is positioned such that said side wall of said melt containing means is received into a space between said first shield tube and said second outer shield tube when said melt containing means is raised by said raising means.

25. Apparatus as recited in claim 24, wherein said barrier surface means comprises an upper surface of an insulator panel means disposed between an outer surface of said heater means and an inner surface of said vessel side wall.

26. Apparatus as recited in claim 19 further comprising first means for cooling an upper portion of said vessel side wall independently of a lower portion of said vessel side wall, said first cooling means further having means for maintaining an axial temperature gradient in said upper portion of said vessel side wall in which an uppermost extent of said upper portion is maintained at a lower temperature than a lowermost extent of said upper portion.

* * * * *